(12) United States Patent
Banna et al.

(10) Patent No.: US 8,492,980 B2
(45) Date of Patent: Jul. 23, 2013

(54) METHODS FOR CALIBRATING RF POWER APPLIED TO A PLURALITY OF RF COILS IN A PLASMA PROCESSING SYSTEM

(75) Inventors: Samer Banna, San Jose, CA (US);
Valentin N. Todorow, Palo Alto, CA (US); Tse-Chiang Wang, Concord, CA (US); Xing Lin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 13/090,916

(22) Filed: Apr. 20, 2011

(65) Prior Publication Data

US 2012/0104950 A1 May 3, 2012

Related U.S. Application Data

(60) Provisional application No. 61/407,717, filed on Oct. 28, 2010.

(51) Int. Cl.
*H05B 31/26* (2006.01)
(52) U.S. Cl.
USPC .................. 315/111.21; 315/111.71; 700/266

(58) Field of Classification Search
USPC .................. 319/121.54, 131.43; 313/231.31; 156/345.48; 315/111.21, 111.71; 356/237.2, 356/72, 326; 700/121, 266, 275, 282
See application file for complete search history.

(56) References Cited

U.S. PATENT DOCUMENTS

| | | | |
|---|---|---|---|
| 6,280,563 B1 * | 8/2001 | Baldwin et al. | 156/345.48 |
| 2010/0025384 A1 | 2/2010 | Todorow et al. | |
| 2011/0094994 A1 * | 4/2011 | Todorow et al. | 216/68 |
| 2011/0097901 A1 * | 4/2011 | Banna et al. | 438/710 |

* cited by examiner

*Primary Examiner* — Daniel D Chang
(74) *Attorney, Agent, or Firm* — Moser Taboada; Alan Taboada

(57) ABSTRACT

Methods for calibrating RF power applied to a plurality of RF coils are provided. In some embodiments, a method of calibrating RF power applied to a first and second RF coil of a process chamber having a power divider to control a first ratio equal to a first magnitude of RF power provided to the first RF coil divided by a second magnitude of RF power provided to the second RF coil, may include measuring a plurality of first ratios over a range of setpoint values of the power divider, comparing the plurality of measured first ratios to a plurality of reference first ratios, and adjusting an actual value of the power divider at a given setpoint value such that the first ratio of the power divider at the given setpoint matches the corresponding reference first ratio to within a first tolerance level.

20 Claims, 4 Drawing Sheets

METHODS FOR CALIBRATING RF POWER APPLIED TO A PLURALITY OF RF COILS IN A PLASMA PROCESSING SYSTEM

CROSS-REFERENCE TO RELATED APPLICATIONS

This application claims benefit of U.S. provisional patent application Ser. No. 61/407,717, filed Oct. 28, 2010, which is herein incorporated by reference.

FIELD

Embodiments of the present invention generally relate to methods of calibrating process equipment having radio frequency (RF) coils.

BACKGROUND

Inductively coupled plasma (ICP) sources can have RF currents flowing along concentric inner and outer coils to inductively couple RF energy into a process gas to form a plasma in a process chamber. The power division between the inner and the outer coil can be controlled by varying the value of a power divider that rations RF power to each coil. For example, the value of the power divider can dictate the power division between the two coils which can result in different on-wafer process performance to control center-to-edge uniformity. Unfortunately, due to variations that may occur in the coils tolerances, RF matching networks components calibrations, or ICP source, the setpoint value of the power divider at the user interface of the process chamber may not provide the intended actual value of, for example, a desired current ratio between the inner and outer coils. Further, variations in chamber components can cause wafer-to-wafer and chamber-to-chamber process variations.

Therefore, the inventors have provided embodiments of methods for calibrating RF power applied to a plurality of RF coils of a process chamber.

SUMMARY

Methods for calibrating RF power applied to a plurality of RF coils of a process chamber are provided herein. In some embodiments, a method of calibrating RF power applied to a plurality of RF coils of a process chamber having a first RF coil and a second RF coil for forming a plasma in the process chamber and a power divider to control a first ratio, wherein the first ratio is equal to a first magnitude of RF power (or RF current) provided to the first RF coil divided by a second magnitude of RF power provided to the second RF coil includes measuring a plurality of first ratios over a range of setpoint values of the power divider, comparing the plurality of measured first ratios to a plurality of reference first ratios, and adjusting an actual value of the power divider at a given setpoint value such that the first ratio of the power divider at the given setpoint matches the corresponding reference first ratio to within a first tolerance level.

In some embodiments, a method of a calibrating RF power applied to a plurality of RF coils of a first process chamber having a first RF coil and a second RF coil for forming a plasma in the first process chamber and a power divider to control a first ratio, wherein the first ratio is equal to a first magnitude of RF power or RF current provided to the first RF coil divided by a second magnitude of RF power or RF current provided to the second RF coil includes determining a first relationship between a plasma characteristic and chamber pressure in the first process chamber, comparing the first relationship to a reference relationship between the plasma characteristic and chamber pressure in a reference process chamber, determining one or more calibration factors used to control a second relationship between an actual value and a setpoint value of the power divider from the comparison, and applying the determined one or more calibration factors to the power divider to adjust the second relationship such that the plasma characteristic occurs at the same setpoint value in the first process chamber as in the reference process chamber. In some embodiments, the plasma characteristic may be a transition between a capacitively coupled plasma and an inductively coupled plasma and/or any other transition due to plasma instability. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
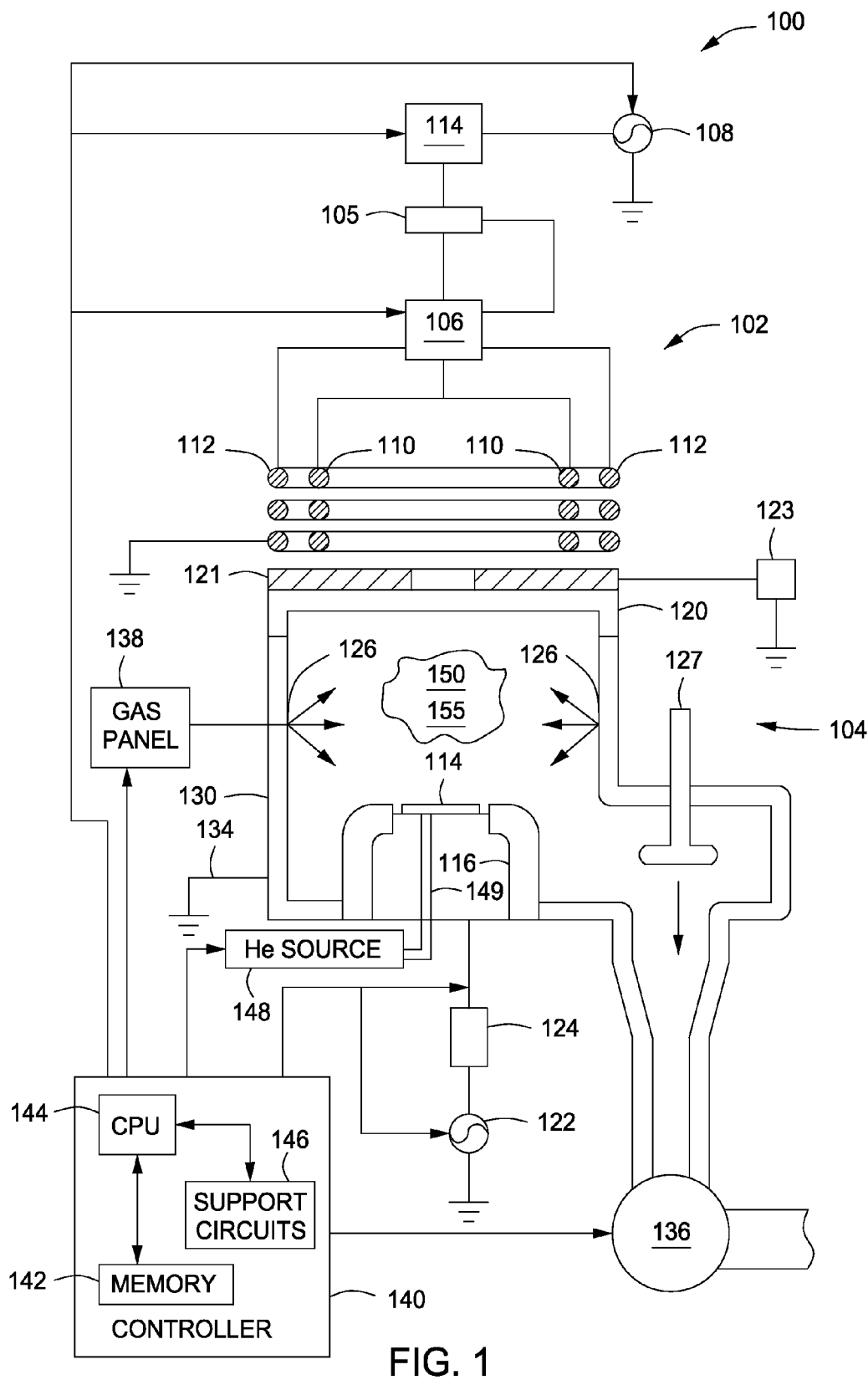
FIG. 1 depicts a schematic side view of an inductively coupled plasma reactor in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for calibrating RF power applied to a plurality of RF coils of a process chamber are disclosed herein. The methods advantageously adjust for tolerance variations in components of the process chamber, such as RF coils, RF power source, matching network and the like, such that the setpoint value of the power divider at the user interface of the process chamber provides the desired ratio of RF power between each of the plurality of RF coils. Embodiments of the methods disclosed herein can be utilized to provide on-wafer performance chamber matching, which can be critical for advanced technology nodes, for example, about 40 nanometers (nm) or less. Embodiments of the inventive methods can be utilized to improve wafer-to-wafer uniformity in the process chamber and/or improve chamber-to-chamber uniformity between process chambers running similar processes. Embodiments of the present invention may provide improved RF calibration to ensure better chamber matching to account for hardware tolerances and/or chamber conditions drift.

FIG. 1 depicts a schematic side view of an inductively coupled plasma reactor (reactor 100) in accordance with some embodiments of the present invention. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment (such as the DPS®, DPS® II, DPS® AE, DPS® G3 poly etcher, DPS® G5 or G5 Minos) or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. For example, suitable exemplary plasma reactors that may be utilized with the inventive methods disclosed herein may be found in U.S. patent application Ser. No. 12/821,609, filed Jun. 23, 2010 by V. Todorow, et al., and entitled, "INDUCTIVE COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY."

The reactor 100 includes an inductively coupled plasma apparatus 102 disposed atop a process chamber 104. The inductively coupled plasma apparatus includes an RF feed structure 106 for coupling an RF power supply 108 to a plurality of RF coils, e.g., a first RF coil 110 and a second RF coil 112. The plurality of RF coils are coaxially disposed proximate the process chamber 104 (for example, above the process chamber) and are configured to inductively couple RF power into the process chamber 104 to form or control a plasma from process gases provided within the process chamber 104.

The methods of the present invention may benefit a reactor configured for standard mode, where RF current flowing along the first RF coil 110 is in-phase with RF current flowing along the second RF coil 112, or dual mode, where the RF current flowing along the first RF coil 110 can be selectively in-phase or out-of-phase with RF current flowing along the second RF coil 112. For example, dual mode ICP sources have been introduced to eliminate M-shape and improve etch rate (ER) uniformity. For example, the reactor 100 as described herein is configured for dual mode operation.

The RF power supply 108 is coupled to the RF feed structure 106 via a match network 114. A power divider 105 may be provided to adjust the RF power respectively delivered to the first and second RF coils 110, 112. The power divider 105 may be coupled between the match network 114 and the RF feed structure 106. Alternatively, the power divider may be a part of the match network 114, in which case the match network will have two outputs coupled to the RF feed structure 106—one corresponding to each RF coil 110, 112. The power divider is discussed in more detail below.

The RF feed structure 106 couples the RF current from the power divider 105 (or the match network 114 where the power divider is incorporated therein) to the respective RF coils. For example, suitable exemplary RF feed structures that may be utilized with the inventive methods disclosed herein may be found in U.S. patent application Ser. No. 12/821,626, filed Jun. 23, 2010 by Z. Chen, et al., and entitled, "RF FEED STRUCTURE FOR PLASMA PROCESSING." In some embodiments, the RF feed structure 106 may be configured to provide the RF current to the RF coils in a symmetric manner, such that the RF current is coupled to each coil in a geometrically symmetric configuration with respect to a central axis of the RF coils, such as by a coaxial structure.

The reactor 100 generally includes the process chamber 104 having a conductive body (wall) 130 and a dielectric lid 120 (that together define a processing volume), a substrate support pedestal 116 disposed within the processing volume, the inductively coupled plasma apparatus 102, and a controller 140. The wall 130 is typically coupled to an electrical ground 134. In some embodiments, the support pedestal 116 may provide a cathode coupled through a matching network 124 to a biasing power source 122. The biasing source 122 may illustratively be a source of up to about 1000 W (but not limited to about 1000 W) at a frequency of approximately 13.56 MHz that is capable of producing either continuous or pulsed power, although other frequencies and powers may be provided as desired for particular applications. In other embodiments, the source 122 may be a DC or pulsed DC source. In some embodiments, the source 122 may be capable of providing multiple frequencies or one or more second sources (not shown) may be coupled to the pedestal 116 through the same matching network 124 or one or more different matching networks (not shown) to provide multiple frequencies.

In some embodiments, a link (not shown) may be provided to couple the RF power supply 108 and the biasing source 122 to facilitate synchronizing the operation of one source to the other. Either RF source may be the lead, or master, RF generator, while the other generator follows, or is the slave. The link may further facilitate operating the RF power supply 108 and the biasing source 122 in perfect synchronization, or in a desired offset, or phase difference. The phase control may be provided by circuitry disposed within either or both of the RF source or within the link between the RF sources. This phase control between the source and bias RF generators (e.g., 108, 122) may be provided and controlled independent of the phase control over the RF current flowing in the plurality of RF coils coupled to the RF power supply 108. Further details regarding phase control between the source and bias RF generators may be found in U.S. patent application Ser. No. 12/465,319, filed May 13, 2009 by S. Banna, et al., and entitled, "METHOD AND APPARATUS FOR PULSED PLASMA PROCESSING USING A TIME RESOLVED TUNING SCHEME FOR RF POWER DELIVERY."

In some embodiments, the dielectric lid 120 may be substantially flat. Other modifications of the chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the dielectric lid 120. The relative position, ratio of diameters of each coil, and/or the number of turns in each coil can each be adjusted as desired to control, for example, the profile or density of the plasma being formed via controlling the inductance on each coil. Each of the first and second coils 110, 112 is coupled through the matching network 114 via the RF feed structure 106, to the RF power supply 108. The RF power supply 108 may illustratively be capable of producing up to about 4000 W (but not limited to about 4000 W) at a tunable frequency in a range from 50 kHz to 13.56 MHz, although other frequencies and powers may be provided as desired for particular applications.

The first and second RF coils 110, 112 can be configured such that the phase of the RF current flowing through the first RF coil can be out-of-phase with respect to the phase of the RF current flowing through the second RF coil. As used herein, the term "out-of-phase" can be understood to mean that the RF current flowing through the first RF coil is flowing in an opposite direction to the RF current flowing through the second RF coil, or that the phase of the RF current flowing through the first RF coil is shifted with respect to the RF current flowing through the second RF coil.

For example, in conventional apparatus, both RF coils are typically wound in the same direction. As such, the RF current is flowing in the same direction in both coils, either clockwise or counterclockwise. The same direction of the winding dictates that the RF current flowing in the two RF coils are always in phase. In embodiments of the present invention, RF current may be provided out-of-phase between the two coils by either external means or by physically winding one of the coils in the opposite direction. By controlling the phase between the coils, an embodiment of the invention has the ability to reduce and eliminate non-uniform etch results, such as the M-shape etch pattern, and furthermore to control the processing (such as etch rate) pattern from center high, to edge high or to a flat and uniform processing pattern. By providing out-of-phase RF current between the coils and by controlling the current ratio between the inner and outer coil, the apparatus facilitates control over the processing pattern to achieve improved uniformity across the substrate.

By providing out-of-phase RF current between the coils, the apparatus reverses the destructive interference between the magnetic fields generated by each coil to be constructive, and, therefore, the typical constructive electric field plasma properties within the reactor may be similarly reversed. For example, the present apparatus may be configured to increase the electric field proximate each of the first and second coils and decrease the electric field between the coils by providing out of phase RF current flowing along the first and second coils. In some embodiments, such as where the RF current in each of the coils is completely out of phase (e.g., reverse current flow or 180 phase difference) the electric fields may be maximized (or localized) proximate each of the first and second coils and minimized (or null) between the coils due to destructive interference between opposing electric fields. A plasma formed using such a coil configuration can advantageously have an improved, e.g., a more uniform, electric field distribution and that components of the plasma may diffuse into the null region of the electric field to provide a more uniform plasma.

In some embodiments, the direction of the RF current flowing through each coil can be controlled by the direction in which the coils are wound. For example, in some embodiments, the first RF coil 110 may be wound in a first direction and the second RF coil 112 may be wound in a second direction which may be opposite the first direction. Accordingly, although the phase of the RF signal provided by the RF power supply 108 is unaltered, the opposing winding first and second directions of the first and second RF coils 110, 112 cause the RF current to be out of phase, e.g., to flow in opposite directions effectively producing a 180° phase shift.

In some embodiments, a power divider 105, such as a dividing capacitor, may be provided between the RF feed structure 106 and the RF power supply 108 to control the relative quantity of RF power provided to the respective first and second coils. For example, as shown in FIG. 1, a power divider 105 may be disposed in the line coupling the RF feed structure 106 to the RF power supply 108 for controlling the amount of RF power provided to each coil (thereby facilitating control of plasma characteristics in zones corresponding to the first and second coils). In some embodiments, the power divider 105 may be incorporated into the match network 114. In some embodiments, after the power divider 105, RF current flows to the RF feed structure 106 where it is distributed to the first and second RF coils 110, 112. Alternatively, the split RF current may be fed directly to each of the respective first and second RF coils.

During start up of the reactor 100, after a cleaning process, periodically, or the like, the reactor 100 may be calibrated so as to insure that setup value of the power divider 105 at the user interface is providing a desired ratio of RF power to the plurality of RF coils, such as the first and second coils 110, 112 of the reactor 100.

Optionally, one or more electrodes (not shown) may be electrically coupled to one of the first or second coils 110, 112, such as the first coil 110. The one or more electrodes may be two electrodes disposed between the first coil 110 and the second coil 112 and proximate the dielectric lid 120. Each electrode may be electrically coupled to either the first coil 110 or the second coil 112, and RF power may be provided to the one or more electrodes via the RF power supply 108 via the inductive coil to which they are coupled (e.g., the first coil 110 or the second coil 112).

In some embodiments, the one or more electrodes may be movably coupled to one of the one or more inductive coils to facilitate the relative positioning of the one or more electrodes with respect to the dielectric lid 120 and/or with respect to each other. For example, one or more positioning mechanisms may be coupled to one or more of the electrodes to control the position thereof. The positioning mechanisms may be any suitable device, manual or automated, that can facilitate the positioning of the one or more electrodes as desired, such as devices including lead screws, linear bearings, stepper motors, wedges, or the like. The electrical connectors coupling the one or more electrodes to a particular inductive coil may be flexible to facilitate such relative movement. For example, in some embodiments, the electrical connector may include one or more flexible mechanisms, such as a braided wire or other conductor. A more detailed description of the electrodes and their utilization in plasma processing apparatus can be found in U.S. patent application Ser. No. 12/182,342, filed Jul. 30, 2008, titled "Field Enhanced Inductively Coupled Plasma (FE-ICP) Reactor," which is herein incorporated by reference in its entirety.

A heater element 121 may be disposed atop the dielectric lid 120 to facilitate heating the interior of the process chamber 104. The heater element 121 may be disposed between the dielectric lid 120 and the first and second coils 110, 112. In some embodiments. the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thereby facilitating uniform plasma formation within the process chamber 104.

During operation, a substrate 114 (such as a semiconductor wafer or other substrate suitable for plasma processing) may be placed on the pedestal 116 and process gases may be supplied from a gas panel 138 through entry ports 126 to form a gaseous mixture 150 within the process chamber 104. The gaseous mixture 150 may be ignited into a plasma 155 in the process chamber 104 by applying power from the plasma source 108 to the first and second coils 110, 112 and optionally, the one or more electrodes (not shown). In some embodiments, power from the bias source 122 may be also provided to the pedestal 116. The pressure within the interior of the chamber 104 may be controlled using a throttle valve 127 and a vacuum pump 136. The temperature of the chamber wall 130 may be controlled using liquid-containing conduits (not shown) that run through the wall 130.

The temperature of the wafer 114 may be controlled by stabilizing a temperature of the support pedestal 116. In one embodiment, helium gas from a gas source 148 may be provided via a gas conduit 149 to channels defined between the backside of the wafer 114 and grooves (not shown) disposed in the pedestal surface. The helium gas is used to facilitate heat transfer between the pedestal 116 and the wafer 114. During processing, the pedestal 116 may be heated by a resistive heater (not shown) within the pedestal to a steady state temperature and the helium gas may facilitate uniform heating of the wafer 114. Using such thermal control, the wafer 114 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 446 are coupled to the CPU 144 for supporting the processor in a conventional manner. These circuits include cache, power supplies, clock circuits, input/output circuitry and subsystems, and the like. The memory 142 stores software (source or object code) that may be executed or invoked to control the operation of the reactor 100 in the manner described below. Specifically, memory 142 stores a calibration module 190 that is executed to calibrate the ratio of current or power applied to the coils 110 and 112. The software routine may also be stored and/or executed by a second CPU (not shown) that is remotely located from the hardware being controlled by the CPU 144.

Figure 2:
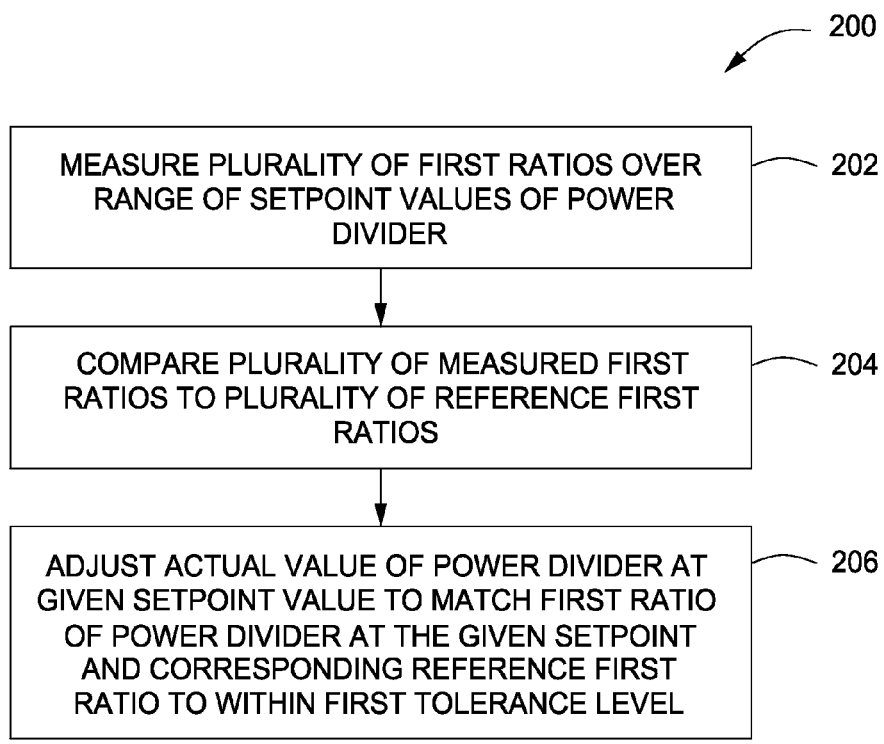
FIG. 2 depicts a flow chart for method of calibrating RF power applied to a plurality of RF coils of a process chamber in accordance with some embodiments of the present invention.
Figure 3:
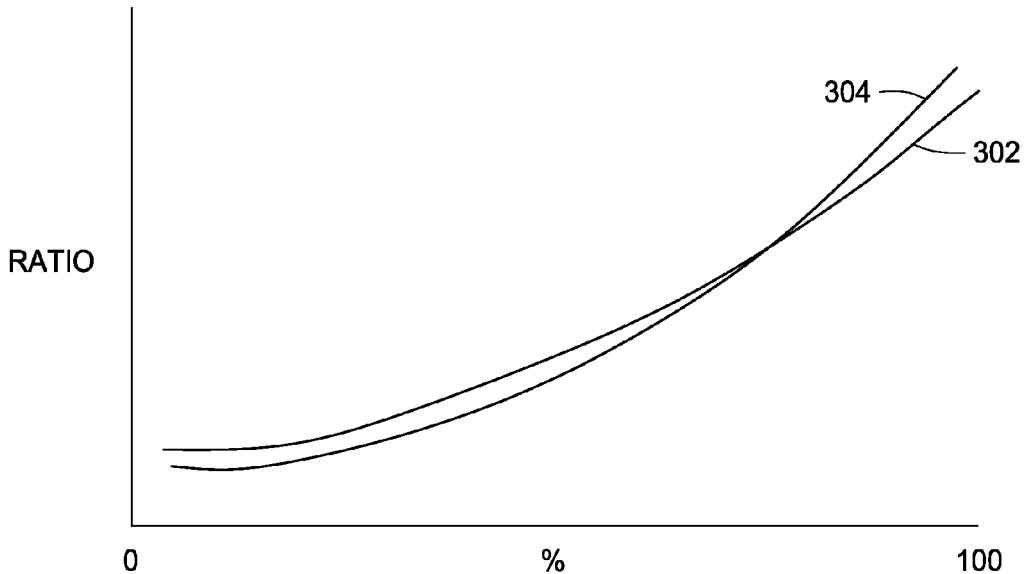
FIG. 3 depicts plots of current ratio over a range of setpoint values measured in different process chambers in accordance with some embodiments of the present invention.

In some embodiments, such as depicted in FIGS. 2 and 3, a method for calibration may include a comparison between measured current ratios over a range of setpoint values of the power divider 105. For example, FIG. 2 depicts a flow chart of a method 200 for calibrating RF power applied to a plurality of RF coils (e.g., first and second coils 110, 112). Method 200 represents a first embodiment of an implementation of calibration module 190. The method 200 begins at 202 by measuring a plurality of first ratios over a range of setpoint values of the power divider 105. For example, the range of setpoint values of the power divider 105 may range from about 0% to 100%, where 100% may be (but is not limited to being) equivalent to providing substantially all RF power to the second coil 112 when the setpoint value is properly calibrated. Similarly, a setpoint value of 0% may be (but is not limited to being) equivalent to providing substantially all RF power to the first coil 110 when the setpoint value is properly calibrated. A setpoint value as referred to herein is meant to describe the value of the ratio of RF power being distributed to each of the plurality of RF coils of the reactor 100 as determined by a user interface of the reactor. For example, a setpoint value may be substantially equivalent to the ratio of RF power distributed to each of the plurality of RF coils after the reactor 100 has been calibrated by the method 200. For example, prior to calibration, the setpoint value may not be substantially equivalent to the ratio of RF power, or outside a desired tolerance level. In one embodiment, each first ratio may be a current or power ratio, where each first ratio may be equivalent to a first magnitude of RF power or RF current provided to the second coil 112 divide by a second magnitude of RF power or RF current provided to the first coil 110. Alternatively, in other embodiments, the ratio may be the current or power of the first coil 110 divided by the current or power of the second coil 112.

The measurement at 202 may be performed using a variety of chamber conditions. For example, in some embodiments, the measurement may be performed when the first and second coils 110, 112 are out-of-phase. For example, a first RF current flowing through the first RF coil 110 may be out-of-phase with a second RF current flowing through the second RF coil 112. Alternatively, the first and second RF coils 110, 112 may be in phase. For example, a first RF current flowing through the first RF coil 110 may be in phase with a second RF current flowing through the second RF coil 112.

In some embodiments, the measurement at 202 may be performed when a substrate is not present in the process chamber. For example, the measurement at 202 may be performed without striking a plasma. Accordingly, there may be no need for a dummy wafer or the like to be present on the substrate support pedestal 116. Alternatively, a substrate may be present, if desired.

In some embodiments, a plasma may be formed in the process chamber prior to performing the measurement at 202. For example, the plasma may be non-damaging to the chamber components, such as a cleaning plasma or the like. Accordingly, the plasma may be formed without a substrate in the chamber. The plasma may be formed from a suitable process gas, for example, such as a process gas comprising at least one of argon (Ar) or chlorine ($Cl_2$). However, other process gases having different compositions may also be used. In operation, the plasma may be formed from the process gas at an initial setpoint value. Then, the setpoint values of the power divider 105 may be swept over the range of setpoint values while measuring each of the plurality of first ratios. Alternatively, a similar operation may be performed without striking a plasma.

The measurement at 202 may produce a plot of the first ratio over a range of setpoint values as illustrated in FIG. 3. For example, the plot 302 represents the measured first ratios over the range of setpoint values of the power divider 105 in the process chamber to be calibrated, e.g., the reactor 100. The plot 304 represents a plurality of reference first ratios over the range of setpoint values of a power divider as measured in a "golden" process chamber, e.g., a process chamber that is known to be calibrated. The plot 304 may be measured in the "golden" process chamber (e.g., reference process chamber) using substantially the same process recipe as used in the process chamber to be calibrated, e.g., the reactor 100. For example, process recipes may include those discussed above, such as with a plasma, without a plasma, in phase RF current, out of phase RF current, and the like. Note, the plots 302 and 304 are representative of the shape of plots that may be generated from the measurements; however, the depicted plots are not created from actual measurements.

A setpoint value of the power divider 105 may be related to an actual value of the power divider 105 by a linear transformation (e.g., a relationship). In some embodiments, an equation which defines the linear transformation may be:

$$DC_{match} = A + a + B \times b \times \frac{DC_{sp}}{100} \quad (1)$$

where $DC_{match}$ is the actual value of the power divider 105, $DC_{sp}$ is the setpoint value (as set by the user), a and b are given parameters characterizing the system, such as an ICP source model, source match or the like, and A and B are calibration factors. For example, A can represent a linear offset and B can represent a linear multiplier. When the measurements are made at 202, the power divider may have A=0 and B=1 which can be default values for the calibration factors. Similarly, a power divider of the reference process chamber may have A and B set to the same default values. Further a and b may be set to the same values in both the reactor 100 and the reference process chamber. However, the relationship between the actual value of the power divider 105 and the measured first ratio may be different that a reference relationship between a reference actual value and the reference first ratios in the reference process chamber. Other transformations besides the linear transformation described by equation (1) may be used.

At 204, a comparison may be made between the plurality of measured first ratios and the plurality of reference first ratios. For example, the comparison may include performing a performing a curve fit, such as a least squares fit or the like, for each of the plots 302, 304. For example, representative curves that may be used to approximate the plots 302, 304 may include polynomial functions or the like. In some embodiments, a third order polynomial function may be used. Alternatively, other curving fitting methods can be used such as different order polynomial fitting, exponential, logarithmic or the like. For example, a first function may be used to approximate the plot 302 and a second function may be used to approximate the plot 304. For example, the first and second functions may take the form:

$$Ra_{ref} = g(DC_{match}) \quad (2)$$

$$Ra_{test} = f(DC_{match}) \quad (3)$$

where $Ra_{ref}$ is a reference first ratio of the reference process chamber and $Ra_{test}$ is a first ratio of the reactor 100. The first and second functions f and g may be substantially similar or different depending on the degree of difference between the reactor 100 and the reference process chamber.

A comparison between the fitted curves for each of the plots 302, 304 may be made to determine the differences, if any, between the fitted curves. For example, the comparison may include a mean square error analysis between the first and second functions, f and g. For example, the error analysis may take the form, but is not limited to:

$$\text{Error} = \sum_{i=1}^{M} [f(DC_{match,p}(i)) - g(DC_{match}(i))]^2 / g(DC_{match}(i)) \quad (4)$$

$$DC_{match,p}(i) = A_p + a + B_p \times b \times \frac{DC_{sp}(i)}{100} \quad (5)$$

$$DC_{match}(i) = a + b \times \frac{DC_{sp}(i)}{100} \quad (6)$$

where a mean square error function may take the form of equation (4) having a variable, $DC_{match,p}(i)$, with variable values of the calibration factors $A_p$ and $B_p$. $DC_{match}(i)$ is the actual value of the power divider of the reference chamber as discussed above. In operation, the values of $A_p$ and $B_p$ may be scanned over a range to minimize the error between the functions, f and g. For example, in some embodiments, $A_p$ may be scanned from about −10 to about 10 and $B_p$ may be scanned from about −0.5 to about 1.5. For example, upon minimization of the error function to within a first tolerance level, if $A_p$ and $B_p$ are about 0 and 1, respectively, then the reactor 100 may be already be calibrated and require no further adjustment. Alternatively, if $A_p$ and $B_p$ are not about 0 and 1, then the method 200 proceeds to 206 where optimized values of $A_p$ and $B_p$ which are determined by the minimization of the error function in Equation (4) are provided to the power divider 105 to provide better matching of the first ratio in the reactor 100 with that of the reference chamber. Other forms of the error function in equation (4) may be shown below by Equations (4a) or (4b):

$$\text{Error} = \sum_{i=1}^{M} |f(DC_{match,p}(i)) - g(DC_{match}(i))| / |g(DC_{match}(i))| \quad (4a)$$

$$\text{Error} = \sum_{i=1}^{M} [f(DC_{match,p}(i)) - g(DC_{match}(i))]^2 / [g(DC_{match}(i))]^2 \quad (4b)$$

At 206, the actual value of the power divider 105 at a given setpoint value may be adjusted such that the first ratio of the power divider 105 at the given setpoint value matches the corresponding reference first ratio to within the first tolerance level. For example, the values of $A_p$ and $B_p$ may be input into the power divider 105. Upon input of $A_p$ and $B_p$ into the power divider 105, each first ratio of the power divider 105 should match the corresponding reference first ratio to within the first tolerance level as determined by minimization of the error function as shown in equation (4).

Adjusting the actual value of the power divider 105 may further include adjusting one or more variable elements of the power divider 105. For example, the one or more variable elements may include a variable capacitor or the like.

Figure 4:
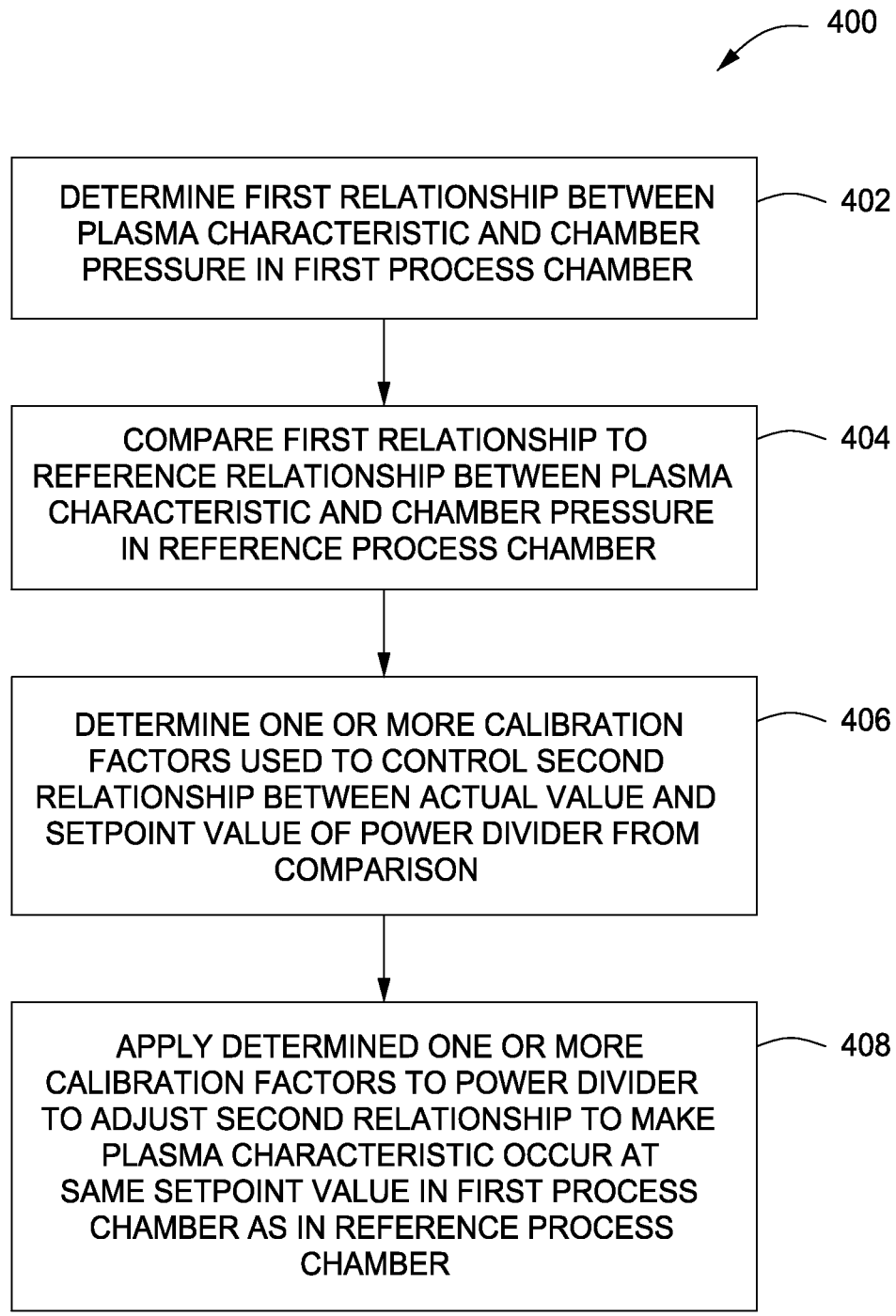
FIG. 4 depicts a flow chart for method of calibrating RF power applied to a plurality of RF coils of a process chamber in accordance with some embodiments of the present invention.

FIG. 4 depicts a flow chart of a method 400 for calibrating RF power applied to a plurality of RF coils of a process chamber in accordance with some embodiments of the present invention. Method 400 represents a second embodiment of an implementation of the calibration module 190. For example, the method 400 may be utilized for calibrating RF power applied to a plurality of RF coils (e.g., first and second coils 110, 112). The method 400 may be utilized as an alternative method to the method 200 described above, or the methods 200, 400 may be used in combination to calibrate the plurality of RF coils. In some embodiments, the method 400 may be utilized when the first and second coils 110, 112 are out of phase.

The method 400 begins at 402 by determining a first relationship between a plasma characteristic and chamber pressure in a chamber that requires calibration or minimally to test if the chamber is calibrated, such as reactor 100. For example, a plasma may be formed in the process chamber, e.g., the reactor 100, at a first chamber pressure. For example, the plasma may be non-damaging to the chamber components, such as a cleaning plasma or the like. Accordingly, the plasma may be formed without a substrate in the chamber. Alternatively, a substrate may be present, if desired. The plasma may be formed from a process gas, for example, such as a process gas comprising at least one of a fluorocarbon gas or an oxygen-containing gas. In some embodiments, the process gas may comprise carbon tetrafluoride ($CF_4$) and oxygen ($O_2$). However, additional variants of the process gas, for example, having different compositions of gases are possible. A ratio between any of the gases comprising the process gas may be controlled. A current ratio or RF power level, a bias power, and/or pressure in the reactor 100 may be controlled when providing the plasma. In operation, the plasma may be formed from the process gas at an initial setpoint value. Then, the setpoint values of the power divider 105 may be swept over the range of setpoint values while measuring a plurality of first self DC bias voltages. In some embodiments, the initial setpoint value may be about 100%, or a maximum in the first ratio.

Figure 5A:
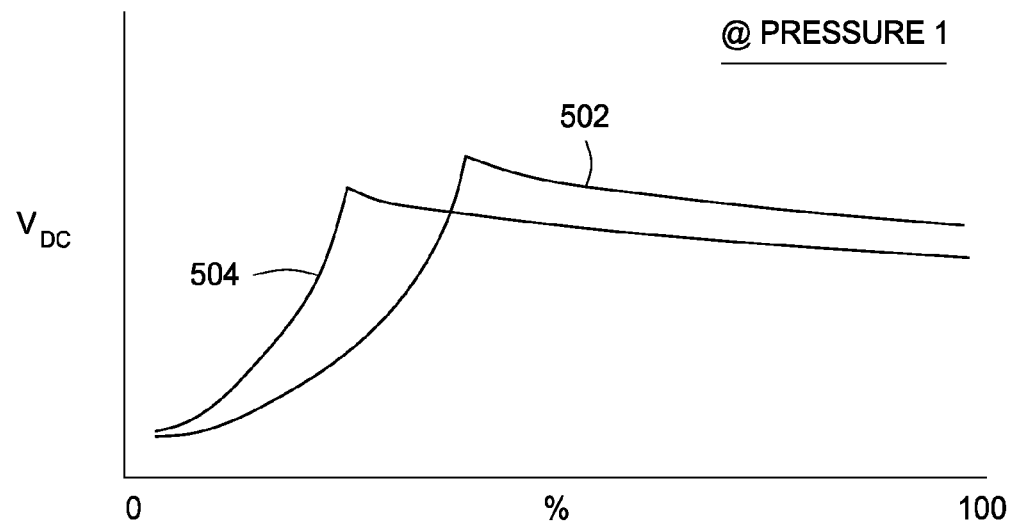
FIG. 5A depicts illustrative plots of DC voltage over a range of setpoint values measured in different process chambers at the same pressure in accordance with some embodiments of the present invention.

The plurality of first self DC bias voltages may be measured over the range of setpoint values of the power divider 105 at the first chamber pressure to determine a first setpoint value at which the plasma characteristic occurs at the first chamber pressure. For example, FIG. 5A depicts the plurality of first self DC bias voltages plotted over a range of setpoint values at the first chamber pressure in accordance with some embodiments of the present invention. The plot 502 may be representative of the plurality of first self DC bias voltages over the range of setpoint values at the first chamber pressure as measured in a test chamber, e.g., the reactor 100. The plot 504 may be representative of a plurality of reference first self DC bias voltages over the range of setpoint values at the first chamber pressure as measure in a "golden" chamber, i.e., a chamber that is known to be calibrated. Each first self DC bias voltage may be representative of the potential difference between a plasma sheath and a surface of a substrate support disposed in the process chamber in which the self DC bias voltage is measured. For example, in reactor 100, each first self DC bias voltage may be a potential difference between a plasma 155 and the surface of the substrate support 116. An RF power, for example, from RF bias source 122, may be applied to substrate support to measure each of the plurality of first self DC bias voltages. Similar to the measurements at 202, the measurements at 402 may be performed with the calibration factors A and B set at a default settings, e.g., A=0 and B=1, in equation (1) for both the reactor 100 and the reference process chamber.

Sweeping the range of setpoint values, for example, from higher values to lower values, there may be a sharp drop off in the first self DC bias voltage in both plots 502, 504 and/or inflection point in the self DC bias voltage curve The sharp drop off and/or inflection point in each plot may be representative of a transition between a capacitively coupled plasma and an inductively coupled plasma or any other type of plasma instability or transition that might characterize the system (depending, for example, on the chemistry used and/ or power levels and/or pressure). The first setpoint value of the plasma characteristic may be the setpoint value where the transition (i.e., the plasma characteristic) occurs. A reference first setpoint value of the plasma characteristic for the reference process chamber in plot 504 may occur at a different setpoint value than in the reactor 100 as shown in FIG. 5A. The plots 502, 504 may be exemplary of a typical curve for self DC bias voltage as a function of setpoint value, however, a curve is not limited to the shapes illustrated in FIG. 5A. For example, a typical curve may show one or more of a sharp drop off in the self DC bias voltage or an inflection point in the self DC bias voltage curve.

Figure 5B:
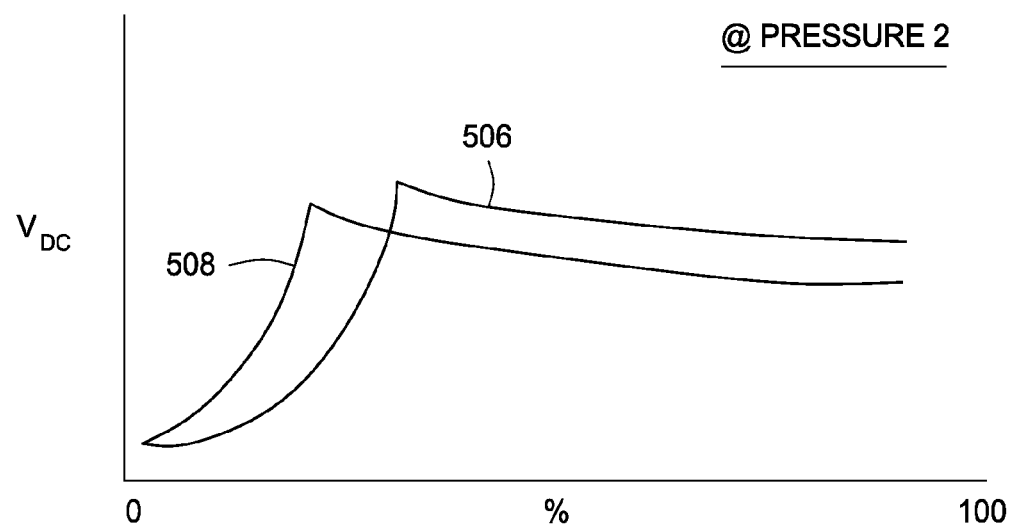
FIG. 5B depicts illustrative plots of DC voltage over a range of setpoint values measured in different process chambers at the same pressure in accordance with some embodiments of the present invention.

Similar to FIG. 5A, FIG. 5B depicts plots of self DC bias voltage over a range of setpoint values measured in different process chambers at a second chamber pressure in accordance with some embodiments of the present invention. For example, the second chamber pressure may be different from the first chamber pressure described above. In FIG. 5B, the plot 506 may be representative of the plurality of second self DC bias voltages over the range of setpoint values at the second chamber pressure as measured in the test chamber, e.g., the reactor 100. The plot 508 may be representative of the plurality of second self DC bias voltages over the range of setpoint values at the second chamber pressure as measure in the "golden" chamber, i.e., a chamber that is known to be calibrated. Similar to the plots 502, 504, the plots 506, 508 may be exemplary of a typical curve for self DC bias voltage as a function of setpoint value, however, a curve is not limited to the shapes illustrated in FIG. 5B. For example, a typical curve may show one or more of a sharp drop off in the self DC bias voltage or an inflection point in the self DC bias voltage curve.

The plots 506, 508 may be generated using the methods described above for generating the plots 502, 504. The primary difference between the plots 506, 508 and the plots 502, 504 is that the latter are generated at the first chamber pressure and the former are generated at the second chamber pressure. Similar to the plots 502, 504, each of plots 506, 508 show a sharp drop off in second self DC bias voltage values which may be representative of a transition between capacitively coupled and inductively coupled plasmas or other plasma instabilities. A second setpoint value at which the plasma characteristic occurs can be determined from the plots 506, 508, i.e. at the setpoint value where the transition occurs in each plot 506, 508.

At 404, a comparison between the first relationship between the plasma characteristic (e.g., the transition) and chamber pressure for the reactor 100 and a reference relationship between a reference plasma characteristic and chamber pressure in a reference process chamber (e.g., the "golden" chamber) can be made. For example, the comparison may include determining a first equation and a second equation, which then may be manipulated to determined the calibration factors, A and B. For example, a first equation (i.e., equation (7) below) may be formed by equating a first actual value (i.e., left hand side of equation (7)) of the power divider 105 at which the plasma characteristic occurs in the first process chamber (e.g., the reactor 100) at the first pressure to a formula (i.e., right hand side of equation (7)) having the calibration factors A and B and the reference first setpoint value as inputs. For example, the first equation may be of the form:

$$a + b \times \frac{DC_{sp,T1}}{100} = A + a + B \times b \times \frac{DC_{sp,G1}}{100} \qquad (7)$$

where the first actual value of the power divider 105 can be computed from the linear transformation (i.e., equation (1)) using the determined first setpoint value, $DC_{sp,T1}$, (i.e., the setpoint value at which transition occurs in plot 502) at which the plasma characteristic occurs in the reactor 100 at the first pressure and known default calibration factors, e.g., A=1 and B=0. The first equation (i.e., equation (7)) equates the first actual value of the power divider 105 to the first reference setpoint value, $DC_{sp,G1}$ through the calibration factors A and B, which are unknown.

Similarly, a second equation (i.e., equation (8) below) may be formed by equating a second actual value (i.e., left hand side of equation (8)) of the power divider 105 at which the plasma characteristic occurs in the first process chamber (e.g., the reactor 100) at the second pressure to a formula (i.e., right hand side of equation (8)) having the calibration factors A and B and the reference first setpoint value as inputs. For example, the second equation may be of the form:

$$a + b \times \frac{DC_{sp,T2}}{100} = A + a + B \times b \times \frac{DC_{sp,G2}}{100} \qquad (8)$$

where the second actual value of the power divider 105 can be computed from the linear transformation (i.e., equation (1)) using the determined second setpoint value, $DC_{sp,T2}$, (i.e., the setpoint value where the transition occurs in plot 506) at which the plasma characteristic occurs in the reactor 100 at the second pressure and known default calibration factors, e.g., A=1 and B=0. The second equation (i.e., equation (8)) equates the second actual value of the power divider 105 to the second reference setpoint value, $DC_{sp,G2}$ through the calibration factors A and B, which are unknown.

At 406, the calibration factors (e.g., A and B) used to control a second relationship (i.e., the linear transformation described by equation (1)) between an actual value and a setpoint value of the power divider 105 can be determined from the comparison at 404. For example, the first and second equations (i.e., equations (7) and (8)) can be solved to determine the calibration factors A and B. For example, as a function of the first and second setpoint values at which the plasma characteristic occurs and the first and second reference setpoint values, the solutions for the calibration factors A and B are:

$$B = \frac{(DC_{sp,T1} - DC_{sp,T2})}{(DC_{sp,G1} - DC_{sp,G2})} \qquad (9)$$

$$A = b * \frac{(DC_{sp,T1} - B \times DC_{sp,G1})}{100} \qquad (10)$$

At 408, the determined calibration factors A and B are applied to the power divider 105 to adjust the second relationship (i.e., the linear transformation in equation (1)) such that the plasma characteristic occurs at the same setpoint value in the first process chamber (i.e., the reactor 100) as in the reference process chamber. For example, adjusting the linear transformation may include adjusting one or more variable elements of the power divider 105 using the determined calibration factors A and B (i.e., as determined by equations (9) and (10)). For example, the one or more variable elements may include a variable capacitor or the like.

Thus, methods for calibrating RF power applied to a plurality of RF coils of a process chamber have been disclosed herein. Embodiments of the methods may advantageously adjust for tolerance variations in components of the process chamber, such as RF coils, RF power source, matching network and the like, such that the setpoint value of the power divider at the user interface of the process chamber provides the desired ratio of RF power between each of the plurality of RF coils. The methods can be utilized to ensure on-wafer performance chamber matching which can be critical for advanced technology nodes, for example, about 40 nanometers (nm) or less. The methods can be utilized to improve wafer-to-wafer uniformity in the process chamber and/or improve chamber-to-chamber uniformity between process chambers running similar processes.

While the foregoing is directed to embodiments of the present invention, other and further embodiments of the invention may be devised without departing from the basic scope thereof.

The invention claimed is:

1. A method of calibrating RF power applied to a plurality of RF coils of a process chamber having a first RF coil and a second RF coil for forming a plasma in the process chamber and a power divider that controls a first ratio equal to a first magnitude of RF power or RF current provided to the first RF coil divided by a second magnitude of RF power or RF current provided to the second RF coil, comprising:
    measuring a plurality of first ratios over a range of setpoint values of the power divider;
    comparing the plurality of measured first ratios to a plurality of reference first ratios; and
    adjusting an actual value of the power divider at a given setpoint value such that the first ratio of the power divider at the given setpoint matches the corresponding reference first ratio to within a first tolerance level.

2. The method of claim 1, wherein adjusting the actual value of the power divider comprises adjusting one or more variable elements of the power divider such that the first ratio at the given setpoint value matches the corresponding reference first ratio to within a first tolerance level.

3. The method of claim 2, wherein the one or more variable elements includes a variable capacitor.

4. The method of claim 1, wherein a first RF current flowing through the first RF coil is out of phase with a second RF current flowing through the second RF coil.

5. The method of claim 1, wherein a first RF current flowing through the first RF coil is in phase with a second RF current flowing through the second RF coil.

6. The method of claim 1, wherein a substrate is not present in the process chamber while performing the calibration method.

7. The method of claim 1, wherein measuring a plurality of first ratios further comprises:
    forming a plasma from a process gas in the process chamber at an initial first ratio of the plurality of first ratios; and
    measuring the plurality of first ratios over a range of setpoint values of the power divider while the plasma is present in the process chamber.

8. The method of claim 7, wherein the process gas comprises at least one of argon (Ar) or chlorine ($Cl_2$).

9. A method of a calibrating RF power applied to a plurality of RF coils of a first process chamber having a first RF coil and a second RF coil for forming a plasma in the first process chamber and a power divider to control a first ratio, wherein the first ratio is equal to a first magnitude of RF power or RF current provided to the first RF coil divided by a second magnitude of RF power or RF current provided to the second RF coil, comprising:
    determining a first relationship between a plasma characteristic and chamber pressure in the first process chamber;
    comparing the first relationship to a reference relationship between the plasma characteristic and chamber pressure in a reference process chamber;

determining one or more calibration factors used to control a second relationship between an actual value and a setpoint value of the power divider from the comparison; and applying the determined one or more calibration factors to the power divider to adjust the second relationship such that the plasma characteristic occurs at the same setpoint value in the first process chamber as in the reference process chamber.

10. The method of claim 9, wherein adjusting the second relationship further comprises:

adjusting one or more variable elements of the power divider using the determined one or more calibration factors.

11. The method of claim 9, wherein a first RF current flowing through the first RF coil is out of phase with a second RF current flowing through the second RF coil.

12. The method of claim 9, wherein determining the first relationship further comprises:

measuring a plurality of first self DC bias voltages over a range of setpoint values of the power divider at a first pressure to determine a first setpoint value at which the plasma characteristic occurs at the first chamber pressure; and measuring a plurality of second self DC bias voltages over the range of setpoint values of the power divider at a second pressure to determine a second setpoint value at which the plasma characteristic occurs at a second chamber pressure.

13. The method of claim 12, wherein an initial setpoint value in the range for each of the measurements of the first and second self DC bias voltages corresponds to a maximum in the first ratio.

14. The method of claim 12, wherein the plasma characteristic is a transition between a capacitively coupled plasma and an inductively coupled plasma.

15. The method of claim 14, wherein comparing the first relationship to the reference relationship further comprises:

equating a first actual value of the power divider at which the plasma characteristic occurs in the first process chamber at the first pressure to a formula having the one or more calibration factors and a reference first setpoint value as inputs to form a first equation having the one or more calibration factors as unknowns, wherein the reference first setpoint value is measured at the first pressure in the reference process chamber; and equating a second actual value of the power divider at which the plasma characteristic occurs in the first process chamber at the second pressure to the formula having the one or more calibration factors and a reference second setpoint value as inputs to form a second equation having the one or more calibration factors as unknowns, wherein the reference second setpoint value is measured at the second pressure in the reference process chamber;

16. The method of claim 15, wherein the first actual value is determined by the second relationship using the determined first setpoint value and one or more known default calibration factors and wherein the second actual value is determined by the second relationship using the determined second setpoint value and the one or more known default calibration factors.

17. The method of claim 15, wherein determining the one or more calibration factors further comprises:

solving the first and second equations to determine the one or more calibration factors.

18. The method of claim 12, determining the first relationship further comprises:

forming a plasma at the first pressure from a process gas comprising at least one of a fluorocarbon or an oxygen-containing gas prior to measuring the plurality of first DC voltages.

19. The method of claim 12, further comprising:

applying an RF power to the substrate support disposed in the first process chamber to measure the plurality of first self DC bias voltages.

20. The method of claim 9, wherein a substrate is not present in the process chamber while performing the calibration method.

* * * * *